United States Patent [19]
Takahashi et al.

[11] Patent Number: 5,864,433
[45] Date of Patent: Jan. 26, 1999

[54] ASTIGMATISM-CORRECTING OPTICAL SYSTEM, PROJECTION EXPOSURE APPARATUS USING THE OPTICAL SYSTEM AND DEVICE MANUFACTURING METHOD

[75] Inventors: Kazuhiro Takahashi; Hirohiko Shinonaga, both of Utsunomiya, Japan

[73] Assignee: Canon Kabushiki Kaisha, Tokyo, Japan

[21] Appl. No.: 887,902

[22] Filed: Jul. 8, 1997

[30] Foreign Application Priority Data

Jul. 11, 1996 [JP] Japan .................................. 8-182044

[51] Int. Cl.$^6$ .................................................. G02B 27/14
[52] U.S. Cl. ............................ 359/637; 359/822; 355/71; 353/101; 250/548; 356/375
[58] Field of Search .................... 359/637, 822, 359/413, 732; 355/71, 53; 353/101; 250/548; 356/12, 400, 375

[56] References Cited

U.S. PATENT DOCUMENTS

| | | | |
|---|---|---|---|
| 2,792,740 | 5/1957 | Haynes | 359/637 |
| 4,666,273 | 5/1987 | Shimizu et al. | 353/101 |
| 4,723,845 | 2/1988 | Mizutani et al. | 356/375 |
| 4,888,614 | 12/1989 | Suzuki et al. | 355/43 |
| 5,117,254 | 5/1992 | Kawashima et al. | 355/43 |
| 5,228,051 | 7/1993 | Matthews | 359/822 |
| 5,251,070 | 10/1993 | Hashimoto et al. | 359/732 |
| 5,289,312 | 2/1994 | Hashimoto et al. | 359/487 |
| 5,424,552 | 6/1995 | Tsuji et al. | 250/548 |
| 5,583,696 | 12/1996 | Takahashi | 359/637 |
| 5,671,091 | 9/1997 | Monroe et al. | 359/635 |

FOREIGN PATENT DOCUMENTS

| | | |
|---|---|---|
| 0 678 768 A2 | 10/1995 | European Pat. Off. . |
| 7-092424 | 4/1995 | Japan . |
| 8-008178 | 1/1996 | Japan . |

*Primary Examiner*—Loha Ben
*Attorney, Agent, or Firm*—Fitzpatrick, Cella, Harper & Scinto

[57] ABSTRACT

In a projection exposure apparatus, two plane-parallel plates, which are equal in thickness and refractive index, are interposed between a projection optical system and a wafer. By tilting these two plane-parallel plates at the same angle in opposite directions with respect to the optical axis of the optical system by means of an adjusting device, astigmatism caused in the optical system by exposure is corrected. The amount of astigmatism is calculated by a calculating device based on the amount of light incident on the optical system per unit of time which is obtained according to the output of a light amount sensor.

22 Claims, 9 Drawing Sheets

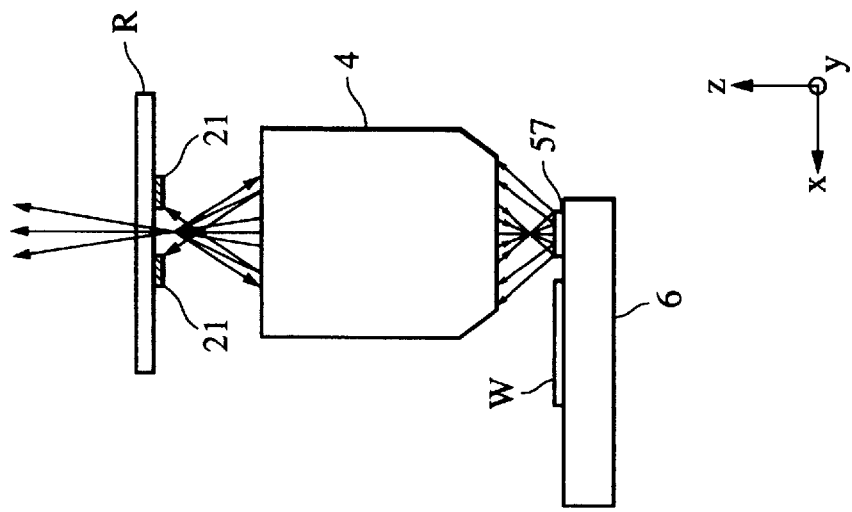
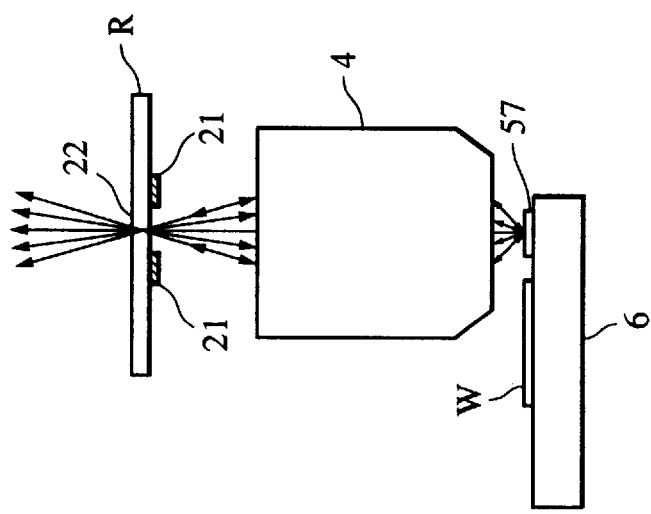

FLOWCHART OF SEMICONDUCTOR DEVICE
MANUFACTURING PROCESSES

WAFER PROCESS

ASTIGMATISM-CORRECTING OPTICAL SYSTEM, PROJECTION EXPOSURE APPARATUS USING THE OPTICAL SYSTEM AND DEVICE MANUFACTURING METHOD

BACKGROUND OF THE INVENTION

1. Field of the Invention

The present invention relates to an aberration-correcting optical system, a projection exposure apparatus, and a device manufacturing method, and more particularly, to an aberration-correcting optical system, a projection exposure apparatus used in manufacturing a semiconductor chip such as an IC and an LSI, an image pickup device such as a CCD and a display device such as a liquid crystal panel, and a device manufacturing method.

2. Description of the Related Art

In a scanning type exposure apparatus, since the cross section of illumination rays for illuminating a mask is shaped like a rectangle or an arc which extends in an orthogonal direction orthogonal to the scanning direction, the cross section of imaging rays produced from a mask pattern also extends in the orthogonal direction. If such imaging rays enter a projection optical system (a system composed of lenses or a combination system of lenses and mirrors), the lenses in the projection optical system absorb part of the imaging rays, and this causes the refractive index distribution and the deformation condition of a refracted plane in the scanning direction to differ from those in the orthogonal direction. Therefore, the best focal position (best imaging position) in a pattern in which the illumination rays are diffracted mainly in the scanning direction and the diffracted rays are made incident on the projection optical system differs from that in a pattern in which the illumination rays are diffracted mainly in the orthogonal direction and the diffracted rays are made incident on the projection optical system (this difference is hereinafter referred to as "astigmatism").

In order to solve the above problem, the applicant of this application proposes in Japanese Patent Laid-Open No. 8-008178 that a heating means for heating a projection optical system should be placed so that the refractive index distribution of the lens and the deformation condition of the refracted plane in the scanning direction is almost equal to those in the orthogonal direction.

SUMMARY OF THE INVENTION

Accordingly, it is an object of the present invention to provide an improved astigmatism-correcting optical system, an improved projection exposure apparatus, and an improved device manufacturing method.

An astigmatism-correcting optical system of the present invention comprises two transparent plane-parallel plates which are arranged along an optical axis and are equal in refractive index and thickness, and means for turning the two plane-parallel plates so as to cause them to tilt at the same angle in opposite directions with respect to the optical axis.

A projection exposure apparatus of the present invention comprises means for illuminating a mask, a projection optical system for projecting a pattern of the mask onto a substrate, the astigmatism of the projection optical system being variable, and a correction optical system for correcting the astigmatism. The correction optical system includes two transparent plane-parallel plates which are arranged along an optical axis and are equal in refractive index and thickness, and means for turning the two plane-parallel plates so as to cause them to tilt at the same angle in opposite directions with respect to the optical axis.

A device manufacturing method of the present invention comprises a step of transferring a device pattern onto a substrate by using the above projection exposure apparatus.

The present invention is intended for a so-called scanning type projection exposure apparatus for exposing a substrate while scanning a mask and the exposed substrate, on which a mask pattern is projected, with respect to a projection optical system and slit illumination rays, and a non-scan projection exposure apparatus for exposing a substrate while keeping a mask and the exposed substrate, on which a mask pattern is projected, almost stationary with respect to a projection optical system and illumination rays. The present invention is also intended for the nonscan projection exposure apparatus because this kind of apparatus has the same problem as that of the abovementioned scanning projection exposure apparatus when an illumination area on a mask is shaped like a rectangle whose length-to-width ratio is significantly deviated from 1.

BRIEF DESCRIPTION OF THE DRAWINGS

FIGS. 7A and 7B are explanatory views showing the principle of measurement of the best focal position by a focus measuring system.

DESCRIPTION OF THE PREFERRED EMBODIMENT

Figure 1:
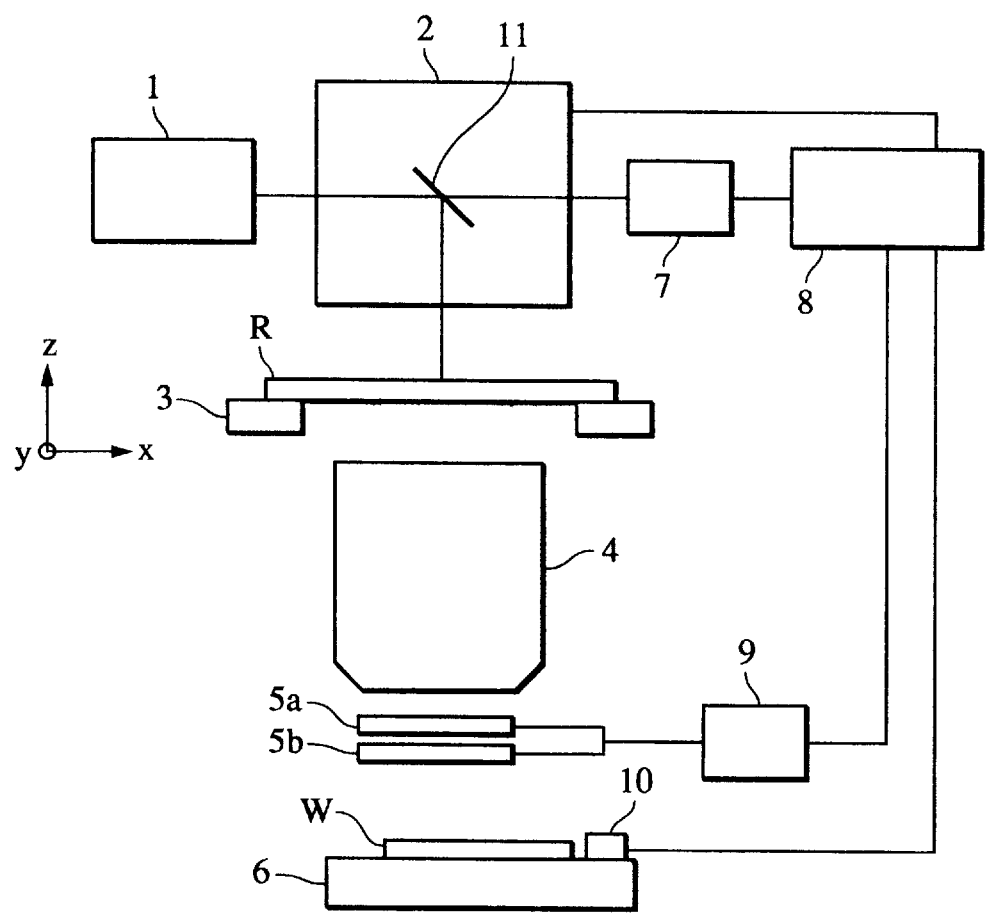
FIG. 1 is a schematic view of a scanning type projection exposure apparatus according to a first embodiment of the present invention.

FIG. 1 is a schematic view of a scanning type projection exposure apparatus according to a first embodiment of the present invention. Referring to FIG. 1, an illumination optical system 2 illuminates a predetermined area of a reticle R with slit-shaped illumination light from a light source 1. A reticle stage 3 holds the reticle (mask) R, and a projection optical system 4 projects a device pattern of the reticle R onto the surface of a wafer W. Two plane-parallel plates 5a and 5b, which are almost equal in refractive index and thickness, are placed on the side of the wafer W. The plates 5a and 5b are made of $SiO_2$, or may be made of $CaF_2$ or $BK_7$ as needed. An XYZ stage 6 holds and moves the wafer W to an exposure range of the optical system 4 while sequentially stepping in the XY direction, and moves the surface of the wafer W in the Z direction in accordance with the result of measurement by a focusing system which is not shown. A half mirror 11 is placed in the illumination optical system 2 to take out a part of the illumination light. The taken out part of illumination light enters a light amount sensor 7, and the exposure amount of the wafer W is detected based on the output of the sensor 7. An angle adjusting means 9 drives the plane-parallel plates 5a and 5b to change the angles thereof, and an illuminance measuring device 10 is placed on the XYZ stage 6. A calculation means 8 calculates the amount of light to be incident on the projection optical system 4 per unit of time, and predicts the change in optical characteristics of the projection optical system 4.

Figure 4:
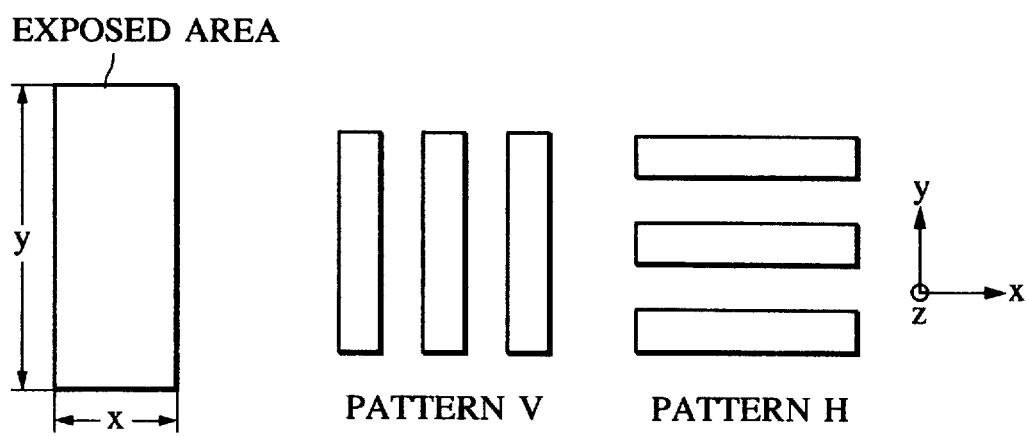
FIG. 4 is an explanatory view showing an exposed area (cross section of illumination light), a vertical pattern V and a horizontal pattern H on a mask.

When exposure is started, the projection optical system 4 absorbs part of the light, the temperature thereof changes, and the optical characteristics thereof also change. The amount of change in focus (focal position) and magnification is calculated and corrected by well-known methods. On the other hand, in a case in which an exposed area of the mask is rectangular, as shown in FIG. 4, the best focal position of a pattern V differs from that of a pattern H depending on exposure. In other words, astigmatism arises.

When a focal position of the pattern V is FV and a focal position of the pattern H is FH, an astigmatism ΔAS is given by the following expression:

$$\Delta AS = FV - FH.$$

This value is calculated by the calculating means 8.

In the calculating means 8, a change in astigmatism as one optical characteristic of the projection optical system 4 is predicted based on the amount Q of exposure light supplied to the reticle R per unit of time and monitored by the light amount sensor 7, the lengths x and y and area S of an exposed area determined by an unillustrated masking blade, and a transmittance T of the reticle R previously measured by the illuminance measuring device 10.

Figure 3:
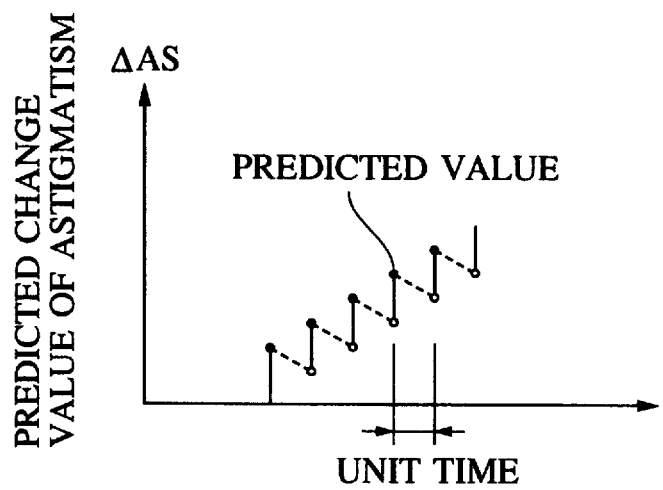
FIG. 3 is a graph showing the relationship between the elapsed time and a predicted astigmatism value.

The length-to-width ratio y/x of the exposed area is one parameter of astigmatism. Although astigmatism does not change when x and y in FIG. 4 are almost equal, if the ratio y/x exceeds 2, the change in astigmatism owing to exposure is not negligible. The coefficient of astigmatism should be determined based on the relationship between the ratio y/x and the change of astigmatism previously found through experimentation. When the coefficient of astigmatism is α, the astigmatism ΔAS is given by the following expressions:

$$\Delta AS = \Delta AS1 = \Delta AS2$$

$$\Delta AS1 = \alpha \cdot (y/x) \cdot T \cdot Q \cdot S \cdot DT$$

$$\Delta AS2 = -\Delta AS' \exp(-k \cdot t)$$

where DT represents exposure time per unit of time, ΔAS' represents a value of astigmatism calculated in a previous unit of time, and k is a parameter representing heat transfer of the projection optical system 4. A predicted value of astigmatism is obtained by predictive calculation using these expressions or an expression represented by a linear combination of these expressions, and changes along an envelope shown in FIG. 3 which can be represented by a function of a natural logarithm.

Figure 2:
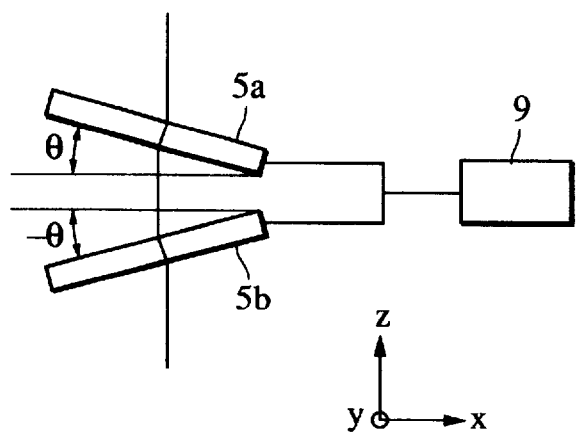
FIG. 2 is an explanatory view of an astigmatism correction means in the apparatus shown in FIG. 1.

FIG. 2 shows the adjusting means 9 for correcting astigmatism. In order to correct astigmatism caused in the optical system 4 according to the prediction result of astigmatism calculated by the calculating means 8, the adjusting means 9 turns and tilts the plane-parallel plates 5a and 5b at an angle θ in opposite directions with respect to a reference plane intersecting the optical axis of the optical system 4.

For example, when NA is 0.6, λ is 248 nm and the thickness of the plane-parallel plates 5a and 5b is 5 mm, the plane-parallel plates 5a and 5b are tilted at about ±30 minutes in order to correct astigmatism of 0.3 μm for a pattern having a line width of 0.25 μm. The material of the plane-parallel plates 5a and 5b is $SiO_2$.

In the scanning type projection exposure apparatus, exposure is performed while scanning the reticle R and the wafer W in synchronization with each other in the X direction of FIG. 1. In this case, the illumination area of the illumination optical system 2 is generally shaped like a slit, and the ratio of X to Y in FIG. 4 is, for example, more than 3. Therefore, it is essential to correct astigmatism. Since scanning is performed in the X direction, y is longer than x in the illumination area of FIG. 4. In this case, the change in focal position of the pattern V is larger than that of the pattern H, and the plane-parallel plates 5a and 5b shown in FIG. 2 are tilted in the XZ plane. When the plane-parallel plates 5a and 5b are thus tilted in the XZ plane, since there is little influence on the focal position of the pattern H, if the adjusting means 9 corrects astigmatisms of the pattern V and the pattern H so as to correct the focal position of the pattern H, the focal position of the pattern H is also corrected.

The light source 1 may be an excimer laser or a lamp such as a mercury lamp.

The number of plane-parallel plates may be more than two as long as the plates to be tilted in opposite directions are equal in number, thickness and refractive index.

Furthermore, the adjusting means 9 also corrects coma by tilting the plane-parallel plates 5a and 5b integrally with respect to the optical axis in some cases.

The projection optical system 4 is composed of only lenses or a combination of lenses and mirrors.

In this embodiment, predictive calculation and correction of astigmatism ΔAS may be performed for every shot (exposed area) on the wafer W, for every plural shots, for every wafer or every plural wafers, or at predetermined periods.

Figure 5:
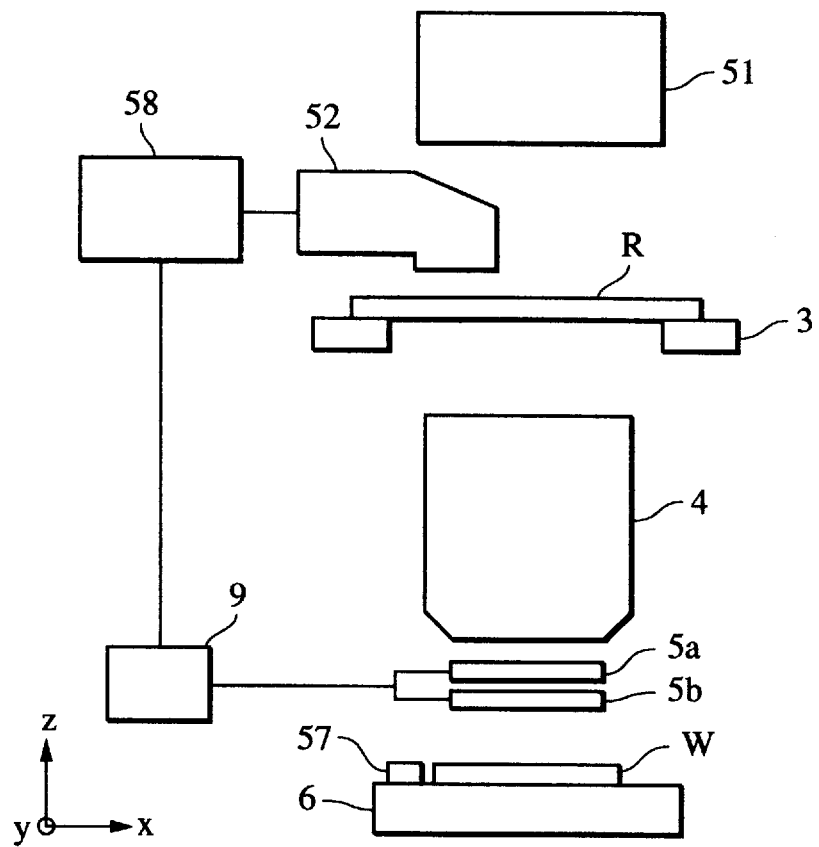
FIG. 5 is a schematic view showing a second embodiment of the present invention.

FIG. 5 is a schematic view of a second embodiment of the present invention. In FIG. 5, numerals 51 and 52 respectively denote an illumination optical system, and a TTL focus measuring system for detecting the best focal plane of a projection optical system 4. A reticle R is held on a reticle stage 3, and a pattern image on the reticle R is formed onto the surface of a wafer W by the projection optical system 4. Two plane-parallel plates 5a and 5b, which are almost equal in thickness and refractive index, are placed on the side of the projection optical system 4 close to the wafer W. An XYZ stage 6 holds and moves the wafer W to the exposure area while sequentially stepping in the XY direction, and moves the surface of the wafer W in the Z direction in accordance with the measurement result of an unillustrated focusing system. A reflecting surface 57 is placed on the XYZ stage 6. An astigmatism measuring means 58 calculates astigmatism of the projection optical system 4 based on the measurement result of the TTL focus measuring system 52, and the astigmatism of the projection optical system 4 is corrected by an adjusting means 9 in accordance with the calculated amount of astigmatism. The plane-parallel plates 5a and 5b are made of $SiO_2$.

Figure 6:
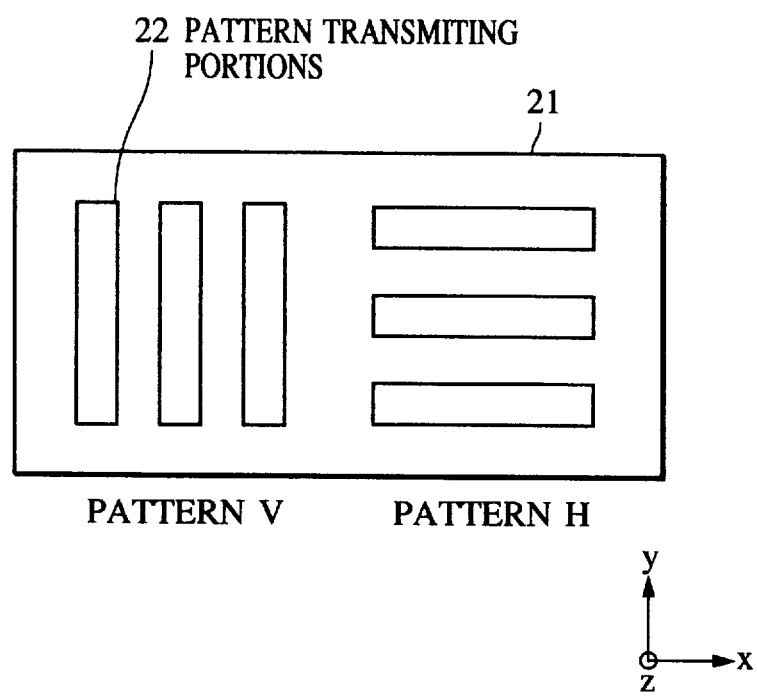
FIG. 6 is an explanatory view showing a vertical pattern V and a horizontal pattern H for focus measurement.
Figure 8:
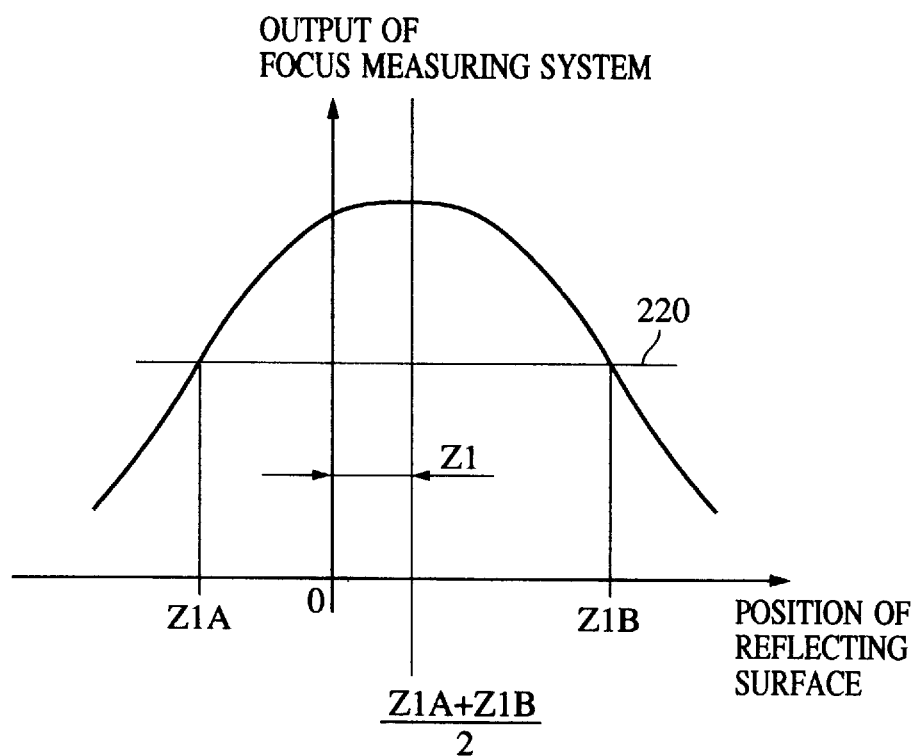
FIG. 8 is a graph showing the relationship between the position of a reflecting surface and an output of the focus measuring system.

Astigmatism is measured as follows. As shown in FIG. 6, a focus measuring mark 21 is put on the reticle R. The mark 21 is located in such an area as to be measured by the TTL focus measuring system 52 when the TTL focus measuring system 52 moves or the reticle R moves as in the scanning projection apparatus. If the reflecting surface 57 is moved to an imaging position of the mark 21 and the XYZ stage 6 is moved in the Z direction, as shown in FIG. 7, when the reflecting surface 57 is adjacent to the best focal position, the light reflected by the reflecting surface 57 transmits by a large amount through pattern transmitting portions 22 of the mark 21. If the reflecting surface 57 is not at the best focal position, since the light is blocked by Cr patterns of the mark 21, the amount of transmitting light decreases. The relationship between the amount of light and the position of the reflecting surface 57 in the Z direction is shown in a graph of FIG. 8. By performing such a measurement for the pattern V and the pattern H, respectively, and calculating the difference between the best focal positions of the patterns, astigmatism of the projection optical system 4 is calculated. The position of the reflecting surface 57 is measured by the above-mentioned focusing system. Such a plane position measuring device as this focusing system is well known.

Astigmatism is corrected by adjusting the angles of the plane-parallel plates 5a and 5b by means of the adjusting means 9 according to the measured astigmatism value. These structures and functions for astigmatism correction are just the same as those in the first embodiment.

If a 45-direction mark and a 135-direction mark are added to the mark in FIG. 6 as marks for measurement, since the direction in which astigmatism of the projection optical system 4 is the biggest and the amount of astigmatism are known, it is possible to correct astigmatism in a desired direction.

If three driving mechanisms such as piezo actuators are spaced at 120° outside an effective diameter of the plane-parallel plates 5a and 5b as a means for driving the adjusting means 9, an arbitrary astigmatism in a desired direction can be adjusted by adjusting the drive amount of the driving mechanisms.

As another method of measuring the focus, a stage reference mark is formed on the reflecting surface 57 and the contrast between the stage reference mark and images of the marks in two directions as shown in FIG. 6 is measured by a CCD or the like located on the side of the mask.

Furthermore, in order to calculate astigmatism, the best focal positions of the respective focus measuring marks in two directions as shown in FIG. 6 may be found by exposing the marks onto the wafer W and measuring the line widths thereof after the wafer W is developed.

In a further focus measuring system, an image of the focus measuring mark 21 is projected onto a photo-detector located on the stage 6 and having a lattice pattern, and the amount of light passing through the lattice pattern is measured when the stage 6 is moved up and down.

In a still further focus measuring system, an image of the focus measuring mark 21 on the reticle R is projected onto a CCD located on the stage 6, and the contrast of the image on the CCD is measured when the stage 6 is moved up and down.

In a still further focus measuring system, a focus measuring mark as shown in FIG. 6 is put on the stage 6, an image of the mark is projected onto the reticle R, and imaging rays are reflected by the reflecting surface of the reticle R and made incident on the projection optical system 4. The image of the mark is projected by the projection optical system 4 onto a photodetector having a lattice pattern on the stage 6, and the amount of light passing through the lattice pattern is measured when the stage 6 is moved up and down.

In a still further focus measuring system, a focus measuring mark shown in FIG. 6 is put on the stage 6, an image of the mark is projected onto a photodetector having a lattice pattern on the side of the reticle R (the lattice pattern is not formed on the reticle R in some cases), and the amount of light passing through the lattice pattern is measured when the stage 6 is moved up and down.

The illumination optical system 51 is provided with a laser such as excimer laser or a lamp such as a mercury lamp, as a light source.

The projection optical system 4 is composed of only lenses or a combination of lenses and mirrors.

In this embodiment, measurement and correction of astigmatism $\Delta AS$ may be performed for every plural shots (exposed areas) on the wafer W, for every wafer or every plural wafers, or at predetermined periods.

In the scanning type exposure apparatus, exposure is performed while scanning the reticle R and the wafer W in synchronization with each other in the X direction of FIG. 5. The main points of astigmatism correction at this time are similar to those mentioned in the first embodiment.

The number of paired plane-parallel plates in this embodiment may be an arbitrary even number more than two as long as the plates are equal in the number of plates to be tilted in opposite directions, thickness and refractive index. Furthermore, coma also can be corrected by turning and tilting more than two plane-parallel plates together in the same direction of the arrow ($\theta$ or $-\theta$ direction) in FIG. 2 by means of the adjusting means 9.

The material of the plane-parallel plates in this embodiment may be not only $SiO_2$, but also $CaF_2$, and $BK_7$ or the like also may be used as the material in a case in which the exposure light takes a form of an i line (having a wavelength of 365 nm).

In the above embodiments, the amount of astigmatism correction is adjusted by turning two paired plane-parallel plates in opposite directions through the same angle.

In the above embodiments, the plane-parallel plates for astigmatism correction may be interposed between the reticle R and the projection optical system 4.

In the above embodiments, the aberration-correcting optical system disclosed in Japanese Patent Laid-Open No. 7-92424 by the applicant of this application may be used to adjust the astigmatism.

Figure 9:
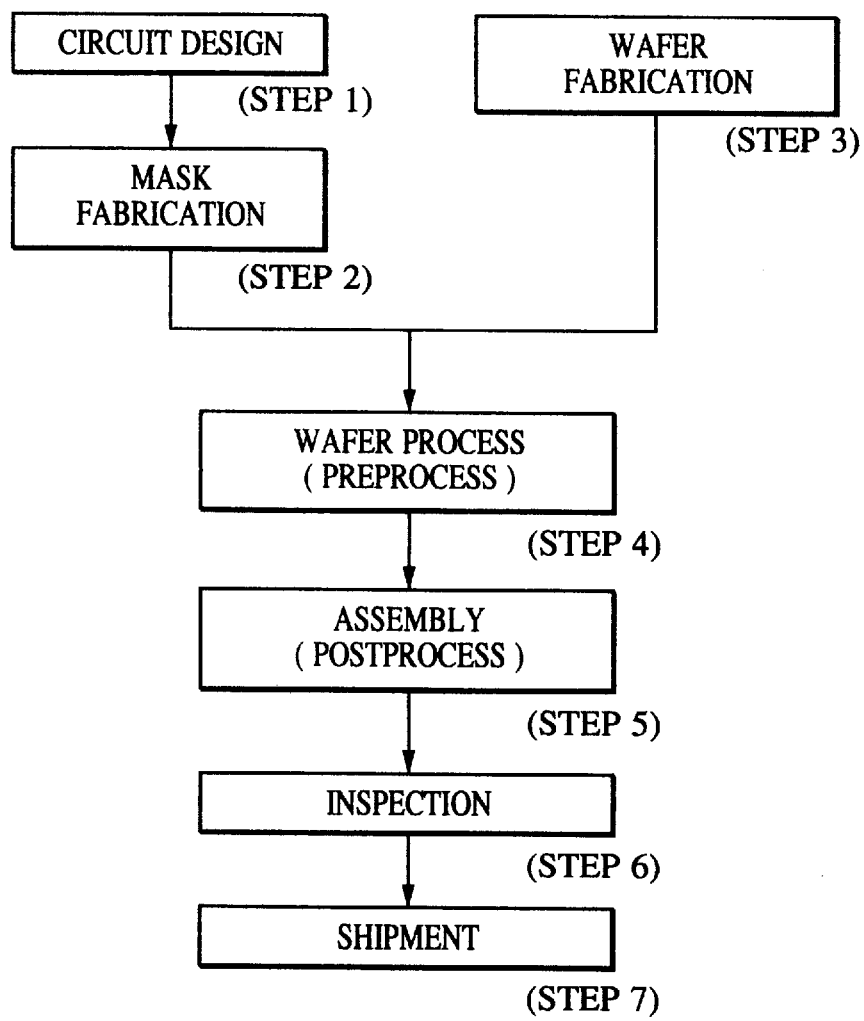
FIG. 9 is a flowchart showing device manufacturing processes.

An embodiment of a device manufacturing method using the above-mentioned exposure apparatus will be next described. FIG. 9 is a flowchart showing processes of manufacturing a semiconductor device (a semiconductor chip such as an IC or an LSI, a liquid crystal panel, a CCD and the like). In Step 1 (circuit design), circuit design of the semiconductor device is performed. In Step 2 (mask fabrication), a mask on which the designed circuit pattern is formed is fabricated. On the other hand, in Step 3 (wafer fabrication), a wafer is fabricated by using a material such as silicon. In Step 4 (wafer process) called a preprocess, an actual circuit is formed on the wafer by lithography using the above prepared mask and wafer. In the next Step 5 (assembly), called a postprocess, a semiconductor chip is manufactured by using the wafer fabricated in Step 4, and an assembly process (dicing, bonding), a packaging process (chip sealing) and the like are included in this step. In step 6 (inspection), the semiconductor device manufactured in Step 5 is subjected to a performance test, an endurance test, and the like. The semiconductor device is completed through these steps, and shipped (Step 7).

Figure 10:
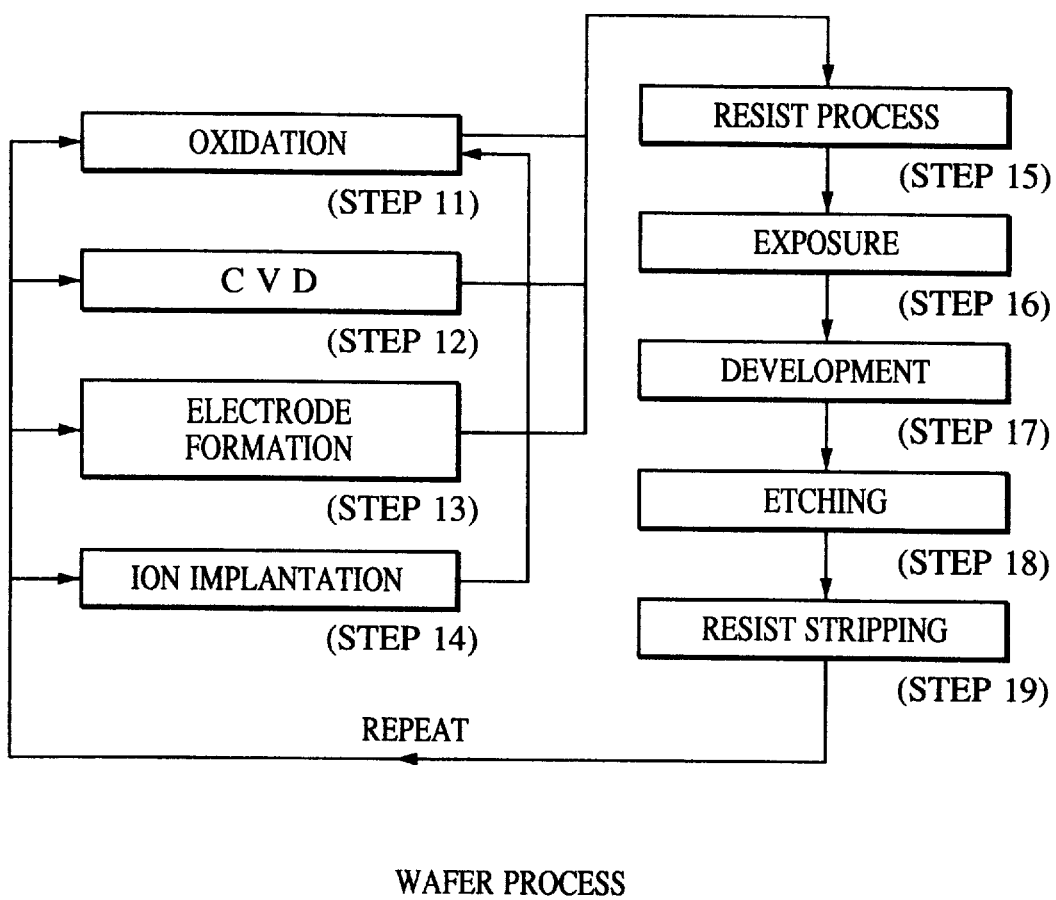
FIG. 10 is a flowchart showing a wafer process.

FIG. 10 is a detailed flowchart of the above wafer process. In Step 11 (oxidation), the surface of the wafer is oxidized. In Step 12 (CVD), an insulating film is formed on the surface of the wafer. In Step 13 (electrode formation), electrodes are formed on the wafer by evaporation. In Step 14 (ion implantation), ions are implanted into the wafer. In Step 15

(resist process), a photosensitive material is applied on the wafer. In Step 16 (exposure), the circuit pattern of the mask is printed on the wafer though exposure by the above-mentioned exposure apparatus. In Step 17 (development), the exposed wafer is developed. In Step 18 (etching), parts other than the developed resist image are cut away. In Step 19 (resist stripping), the portion of the resist which is unnecessary after etching is removed. By repeating these steps, multiple circuit patterns are formed on the wafer.

The use of the manufacturing method in this embodiment makes it possible to manufacture a highly integrated device which has been difficult to manufacture.

What is claimed is:

1. An astigmatism-correcting optical system for correcting astigmatism, said system comprising:
    two transparent plane-parallel plates arranged along an optical axis and being equal in refractive index and thickness; and
    means for turning said two plane-parallel plates so as to cause them to tilt at the same angle in opposite directions with respect to the optical axis.

2. An astigmatism-correcting optical system according to claim 1, wherein said turning means comprises means for turning said two plane-parallel plates in the same direction.

3. A projection exposure apparatus comprising:
    means for illuminating a mask;
    a projection optical system for projecting a pattern of the mask onto a substrate, astigmatism of said projection optical system being variable; and
    a correction optical system for correcting the astigmatism, said correction optical system comprising (i) two transparent plane-parallel plates arranged along an optical axis and being equal in refractive index and thickness, and (ii) means for turning said two plane-parallel plates so as to cause them to tilt at the same angle in opposite directions with respect to the optical axis.

4. A projection exposure apparatus according to claim 3, further comprising means for turning said two plane-parallel plates integrally.

5. A projection exposure apparatus according to claim 3, further comprising calculation means for calculating the astigmatism of said projection optical system.

6. A projection exposure apparatus according to claim 3, further comprising measurement means for measuring the astigmatism of said projection optical system.

7. A projection exposure apparatus according to claim 3, further comprising calculation means for calculating the astigmatism of said projection optical system, wherein said turning means turns said two plane-parallel plates in accordance with the calculated astigmatism.

8. A projection exposure apparatus according to claim 3, further comprising measurement means for measuring the astigmatism of said projection optical system, wherein said turning means turns said two plane-parallel plates in accordance with the measured astigmatism.

9. A device manufacturing method comprising:
    illuminating a mask;
    projecting, using a projection optical system, a pattern of the mask onto a substrate, astigmatism of the projection optical system being variable;
    correcting, using a correction optical system, the astigmatism, the correction optical system including (i) two transparent plane-parallel plates arranged along an optical axis and being equal in refractive index and thickness, and (ii) means for turning said two plane-parallel plates so as to cause them to tilt at the same angle in opposite directions with respect to the optical axis; and
    transferring a device pattern onto a substrate using the projection optical system and the correction optical system.

10. A device manufacturing method according to claim 9, further comprising turning the two plane-parallel plates integrally.

11. A device manufacturing method according to claim 9, further comprising calculating the astigmatism of the projection optical system.

12. A projection exposure apparatus according to claim 9, further comprising measuring the astigmatism of the projection optical system.

13. A device manufacturing method according to claim 9, further comprising calculating the astigmatism of the projection optical system, and turning the two plane-parallel plates in accordance with the calculated astigmatism.

14. A projection exposure method according to claim 9, further comprising measuring the astigmatism of the projection optical system, and turning the two plane-parallel plates in accordance with the measured astigmatism.

15. A projection exposure apparatus comprising:
    means for illuminating a mask;
    a projection optical system for projecting a pattern of the mask onto a substrate, said projection optical system producing an astigmatism; and
    a correction optical system for correcting the astigmatism, said correction optical system comprising (i) two transparent plane-parallel plates arranged along an optical axis and being equal in refractive index and thickness, and (ii) means for turning said two plane-parallel plates so as to cause them to tilt at the same angle in opposite directions with respect to the optical axis.

16. A projection exposure apparatus according to claim 15, wherein said turning means comprises means for turning said two plane-parallel plates in the same direction.

17. A projection exposure apparatus according to claim 15, further comprising calculation means for calculating the astigmatism of said projection optical system.

18. A projection exposure apparatus according to claim 15, further comprising measurement means for measuring the astigmatism of said projection optical system.

19. A device manufacturing method comprising the steps of:
    illuminating a mask;
    projecting, using a projection optical system, a pattern of the mask onto a substrate, the projection optical system producing an astigmatism;
    correcting, using a correction optical system, the astigmatism, the correction optical system including (i) two transparent plane-parallel plates arranged along an optical axis and being equal in refractive index and thickness, and (ii) means for turning said two plane-parallel plates so as to cause them to tilt at the same angle in opposite directions with respect to the optical axis; and
    transferring a device pattern onto a substrate using the projection optical system and the correction optical system.

20. A device manufacturing method according to claim 19, further comprising turning the two plane-parallel plates in the same direction.

21. A device manufacturing method according to claim 19, further comprising calculating the astigmatism of the projection optical system.

22. A projection exposure apparatus according to claim 19, further comprising measuring the astigmatism of the projection optical system.

* * * * *

UNITED STATES PATENT AND TRADEMARK OFFICE
CERTIFICATE OF CORRECTION

PATENT NO. : 5,864,433

DATED : January 26, 1999

INVENTORS : KAZUHIRO TAKAHASHI, ET AL.

It is certified that error appears in the above-identified patent and that said Letters Patent is hereby corrected as shown below:

COLUMN 2:

line 18, "abovementioned" should read --above-mentioned--.

COLUMN 8:

line 9, "projection exposure apparatus" should read --device manufacturing method--;
    line 15, "projection exposure" should read --device manufacturing--; and
    line 63, "projection exposure apparatus" should read --device manufacturing method--.

Signed and Sealed this

Fourteenth Day of September, 1999

*Attest:*

Q. TODD DICKINSON

*Attesting Officer*     *Acting Commissioner of Patents and Trademarks*